United States Patent [19]
Hariton et al.

[11] Patent Number: 6,104,588
[45] Date of Patent: Aug. 15, 2000

[54] LOW NOISE ELECTROSTATIC DISCHARGE PROTECTION CIRCUIT FOR MIXED SIGNAL CMOS INTEGRATED CIRCUITS

[75] Inventors: Dan Ion Hariton, Pinole; Ronald Pasqualini, Los Altos, both of Calif.

[73] Assignee: National Semiconductor Corporation, Santa Clara, Calif.

[21] Appl. No.: 09/127,221

[22] Filed: Jul. 31, 1998

[51] Int. Cl.$^7$ ...................................................... H02H 3/00
[52] U.S. Cl. ............................... 361/111; 361/56; 361/58; 361/118
[58] Field of Search ............................... 361/56, 58, 91.1, 361/118, 119, 127, 111

[56] References Cited
U.S. PATENT DOCUMENTS 5,301,084  4/1994  Miller ........................................ 361/111

*Primary Examiner*—Stephen W. Jackson
*Attorney, Agent, or Firm*—Baker & McKenzie

[57] ABSTRACT

An electrostatic discharge (ESD) protection circuit includes circuitry for providing protection against ESD events which occur either within an ESD pad ring (intra-ring) or between different ESD pad rings (inter-ring). Self-triggering voltage clamp circuits or back-to-back diode circuits can be used to properly interconnect the positive polarity rails and the negative polarity rails of the ESD pad rings. Self-triggering voltage clamp circuits are advantageous in that they provide improved ac signal isolation (i.e. reduced noise coupling between the ESD pad rings, and thus reduced noise coupling from the digital I/O pads to the analog I/O pads).

25 Claims, 10 Drawing Sheets

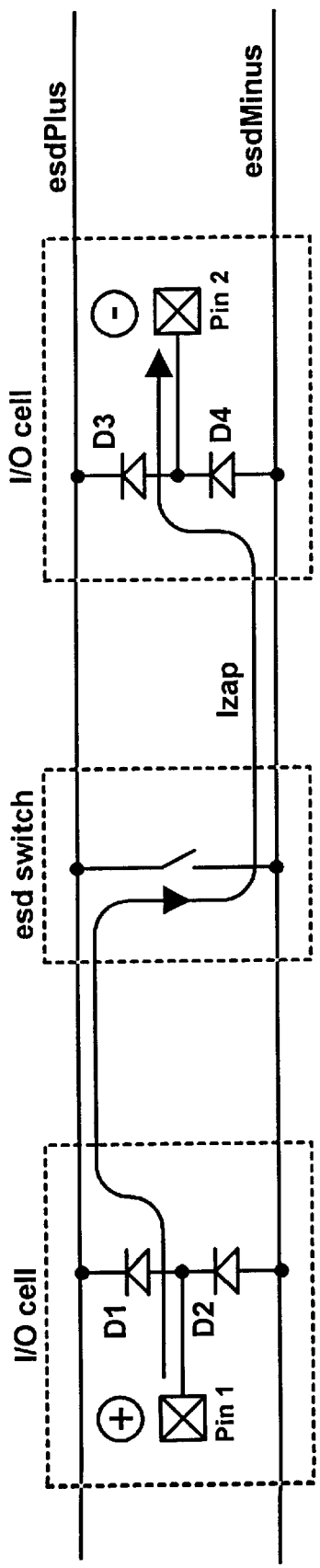
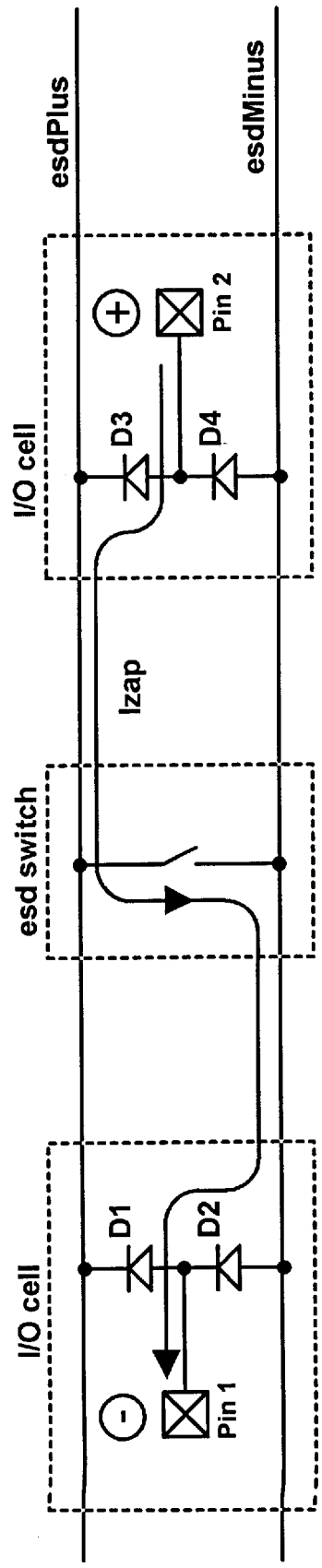
Fig. 1A
Fig. 1B

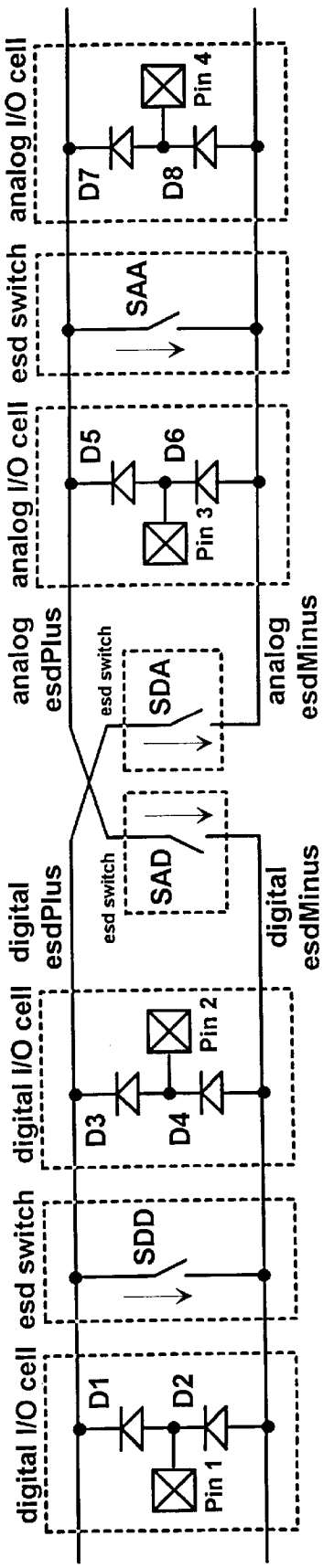

Fig. 6

NOTES:
1) Esd switch SDD closes for all digital pin to digital pin zaps.
2) Esd switch SAA closes for all analog pin to analog pin zaps.
3) Esd switch SDA closes when a digital pin is zapped positively with respect to an analog pin.
4) Esd switch SAD closes when an analog pin is zapped positively with respect to a digital pin.
5) All esd switches are unidirectional (current flows in the direction of the arrow).

| Case Num. | Zap Case: Pins Being Zapped | Zap Type | Esd Switch Used | Esd Diodes Used |
|---|---|---|---|---|
| 1 | pin1+ to pin2- | digital pin to digital pin | SDD | D1, D4 |
| 2 | pin2+ to pin1- | digital pin to digital pin | SDD | D3, D2 |
| 3 | pin3+ to pin4- | analog pin to analog pin | SAA | D5, D8 |
| 4 | pin4+ to pin3- | analog pin to analog pin | SAA | D7, D6 |
| 5 | pin1+ to pin3- | digital pin to analog pin | SDA | D1, D6 |
| 6 | pin3+ to pin1- | analog pin to digital pin | SAD | D5, D2 |
| 7 | pin1+ to pin4- | digital pin to analog pin | SDA | D1, D8 |
| 8 | pin4+ to pin1- | analog pin to digital pin | SAD | D7, D2 |
| 9 | pin2+ to pin3- | digital pin to analog pin | SDA | D3, D6 |
| 10 | pin3+ to pin2- | analog pin to digital pin | SAD | D5, D4 |
| 11 | pin2+ to pin4- | digital pin to analog pin | SDA | D3, D8 |
| 12 | pin4+ to pin2- | analog pin to digital pin | SAD | D7, D4 |

Fig. 7

| | Single Pair of Esd Rings (prior art) | | | | Double Pair of Esd Rings (present invention) | | | |
|---|---|---|---|---|---|---|---|---|
| | Simulation #1 | Simulation #2 | Simulation #3 | Simulation #4 | Simulation #5 | Simulation #6 | Simulation #7 | Simulation #8 |
| | Floating ESD Rings, Digital Driver Output Impedance Equal to zero ohms | Floating ESD Rings, Digital Driver Output Impedance Equal to 100 ohms | Connected ESD Rings, Digital Driver Output Impedance Equal to zero ohms | Connected ESD Rings, Digital Driver Output Impedance Equal to 100 ohms | Floating ESD Rings, Digital Driver Output Impedance Equal to zero ohms | Floating ESD Rings, Digital Driver Output Impedance Equal to 100 ohms | Connected ESD Rings, Digital Driver Output Impedance Equal to zero ohms | Connected ESD Rings, Digital Driver Output Impedance Equal to 100 ohms |
| Peak to peak voltage on digital esdVDDring (8 places, 4 corners & center of each side) | 690mv | 261mv | 700mv | 64mv | 650mv | 300mv | 900mv | 126mv |
| Peak to peak voltage on digital esdVSSring (8 places, 4 corners & center of each side) | 600mv | 217mv | 600mv | 65mv | 400->700mv | 226mv | 700mv | 106mv |
| Peak to peak voltage on analog esdVDDring (8 places, 4 corners & center of each side) | NA | NA | NA | NA | 20->37mv | 15mv | 25->45mv | 2mv |
| Peak to peak voltage on analog esdVSSring (8 places, 4 corners & center of each side) | NA | NA | NA | NA | 22mv | 10mv | 60mv | 1.1mv |
| Peak noise voltage on any analog + or analog-input (with respect to ground) | 20->70mv | 4.8mv | 40->80mv | 3.5mv | 1->5mv | 120->360uv | 3->5mv | 0.2mv |
| Peak differential voltage between analog analog +/- inputs | 400uv | 10uv | 200->400uv | 10->30uv | 30->70uv | 2->5uv | 20->40uv | 4->5uv |

Fig. 9

LOW NOISE ELECTROSTATIC DISCHARGE PROTECTION CIRCUIT FOR MIXED SIGNAL CMOS INTEGRATED CIRCUITS

BACKGROUND OF THE INVENTION

1. Field of the Invention

The present invention relates to electrostatic discharge (ESD) protection for integrated circuits (ICs), and in particular, to low noise ESD protection for the analog inputs present on mixed signal (analog and digital) complementary metal oxide semiconductor (CMOS) integrated circuits. Digital switching noise, which is coupled into the analog inputs through the ESD protection circuitry, is dramatically reduced.

2. Description of the Related Art

FIGS. 1A and 1B show a simplified model for a conventional ESD protection circuit. For simplicity, only the two input/output (I/O) cells being "zapped" by the ESD event are shown. The circuit includes: two wires or nodes (esdPlus and esdMinus) which connect the circuit elements shown, two ESD protection diodes located inside each I/O cell (connected from the I/O cell pin to the esdPlus and esdMinus nodes), and an ESD switch which automatically closes during an ESD event. The two pins being zapped will be adequately protected during an ESD event if the peak voltage drop between them is less than the gate oxide breakdown voltage, BVox.

As shown in FIG. 1A, Pin 1 is being zapped positively with respect to Pin 2, so that diodes D1 and D4 are the only diodes conducting ESD current Izap. Conversely, in FIG. 1B, Pin 2 is being zapped positively with respect to Pin 1. In this case diodes D2 and D3 are the only diodes conducting ESD current Izap. In both examples the ESD current flows through the ESD switch (which closes only during an ESD event) in the same direction, independent of the polarity of the ESD event. Thus the ESD switch can be a unidirectional switch.

A simplified IC chip-level model for a conventional ESD protection circuit is shown in FIGS. 2 and 3. As shown in FIG. 3, this model includes: two concentric ESD rings (esdPlusRing and esdMinusRing) which encircle the periphery of the entire chip, passing through each I/O cell; two ESD protection diodes located inside each I/O cell (connected from the I/O pin to the two concentric ESD rings); and four ESD switches which automatically close during an ESD event, with one switch located in each corner of the chip.

As discussed above, ESD current will flow from the I/O pin being zapped positive to the I/O pin being zapped negative. As shown in FIGS. 2 and 3, this ESD current can flow through two ESD protection diodes, four corner switches and portions of the two ESD rings. The two pins being zapped will be adequately protected if the peak voltage drop between them (Vpin2pin) is less than the gate oxide breakdown voltage BVox. The value for the pin-to-pin voltage, Vpin2pin, can be computed using Equation (1). Equation 1 is based upon the simplified DC circuit model shown in FIG. 2. This simplified model yields a value for Vpin2pin which is normally within 10 to 20 percent of the value obtained from a transient ESD circuit simulation.

$$Vpin2pin = Izap*(2*Rfwd + Rh/2 + Rv/4 + Rs/4) + 2*Vfwd \quad (1)$$

where:

$Vpin2pin$ = Peak pin-to-pin voltage between the two pads being zapped $Izap$ = Peak ESD current for the Human Body Model (HBM), i.e. approximately 1.5 amps for a 2 kilovolt ESD zap $Rfwd$ = Forward resistance of the ESD protection diode $Rh$ = Wire resistance of the "horizontal" portions of the esdPlusRing and esdMinusRing wires on the top and bottom sides of chip $Rv$ = Wire resistance of the "vertical" portions of the esdPlusRing and esdMinusRing wires on the left and right sides of chip $Rs$ = Peak resistance of the ESD corner switch during an ESD event $Vfwd$ = Forward voltage drop across the ESD protection diode at low forward current (approximately .8 volts)

It should be noted that FIG. 2 only shows the ESD circuitry for the two I/O pins which are being zapped. Thus the on-chip I/O circuitry which is also connected to these two I/O pins is not shown. In addition, the zapping circuit in FIG. 2 is represented by a current source Izap. This current source representation is sufficient because the value of Izap is almost entirely determined by the external zapping circuitry (i.e. the value of Izap is barely affected by the on-chip ESD protection circuitry).

A worst case ESD event occurs when the two pins being zapped are the furthest possible distance apart (i.e. diametrically opposed, on opposite sides of the chip). This produces the maximum IR (current times resistance) voltage drop in the ESD rings.

An example of an ESD corner switch is shown in FIG. 4. This corner switch employs an RC time constant (resistance times capacitance) to trigger an N-channel MOSFET, M1, which conducts approximately ¼ of the total ESD current, Izap, as shown in FIG. 2. The resistance and capacitance values in FIG. 4 are chosen such that the RC time constant will be long in comparison to the duration of an ESD event (i.e. approximately 5–25 nanoseconds), but short in comparison to the rise time of the power supply voltage (which cannot be faster than 4 milliseconds for a 60 Hertz AC line). This restriction ensures that the switch will turn on during an ESD event, but will not turn on when the power supply voltage is initially applied. This type of ESD switch circuit is described in more detail in commonly assigned, co-pending U.S. patent application Ser. No. 09/005,197, filed Jan. 9, 1998, and entitled "Voltage Clamp Circuit for ESD Protection," the disclosure of which is hereby incorporated by reference. Further examples of other switch circuits suitable for use as ESD corner switches can be found in U.S. Pat. No. 5,239,440, entitled "Electrostatic Discharge Protection for Integrated Circuits," the disclosure of which is hereby incorporated by reference.

The use of dual ESD rings, as shown in FIGS. 2 and 3, is advantageous because it provides complete ESD protection for chips which have multiple, electrically isolated power supply pins and ground pins. This is particularly important for mixed signal CMOS chips, which often contain many separate (i.e. isolated) digital and analog supply pins, and digital and analog ground pins. Thus it should be understood that each of the pins being zapped in FIGS. 2 and 3 can be of any pin type (i.e. input, output, bi-directional, power supply and ground).

A major disadvantage of the circuit implementation shown in FIG. 3 is that it results in a high level of noise coupling between the digital circuit pins and the analog circuit pins. A simplified circuit model for this noise coupling is shown in FIG. 5. As shown in FIG. 5, the digital noise is generated by the on-chip digital output drivers and by the off-chip digital input drivers. This noise is AC-coupled onto the noise-sensitive analog input pins through the ESD protection rings (esdPlus and esdMinus). The digital noise is AC-coupled onto the ESD protection rings through the parasitic anode-to-cathode diode capacitances, $C_{diode}$, which are associated with the ESD protection diodes.

Referring to FIG. 5, the parasitic wire capacitance $C_{wire}$ of the ESD rings (esdPlus and esdMinus) is generally much greater than the ESD diode capacitance $C_{diode}$. However, when a number of digital drivers switch high or low at the same time, the relatively small diode capacitances $C_{diode}$ are then effectively connected in parallel to the same data (noise) source. For example, up to 48 digital output drivers can simultaneously change state on the PCI bus. In this case the multiple small diode capacitances $C_{diode}$ can act together as a single, but much larger, diode capacitance.

The amount of noise which is coupled into the analog inputs depends upon a number of circuit parameters. For example, the noise injected by the on-chip and off-chip digital signal drivers tends to increase as: 1) their output impedance decreases, 2) their output voltage swing increases, and 3) their rise and fall times decrease.

Susceptibility of the ESD rings (esdPlus and esdMinus) to injected noise depends upon whether they are left floating or are connected to a power supply line and a ground line. (Connection of esdPlus to more than one power supply line would violate the required isolation between power supply lines, while connection of esdMinus to more than one ground line would violate the required isolation between ground lines).

Susceptibility of the analog circuitry to injected noise tends to increase as the input impedance of the analog circuitry increases.

In order to prevent false triggering of the ESD protection circuitry during normal chip operation, the ESD rings (esdPlus and esdMinus) are usually not left floating. Thus esdPlus is normally connected to one power supply line, while esdMinus is normally connected to one ground line. Assuming that these connections have been made, noise injection into the analog circuitry will still not be completely eliminated. The main reasons for this are that: 1) the ESD rings have non-zero resistance, 2) the ESD rings are connected to power supply and ground pins which have non-zero inductance, and 3) the ESD rings are connected to a non-ideal power supply, i.e. a power supply which has a non-zero output impedance.

SUMMARY OF THE INVENTION

In accordance with the present invention, an electrostatic discharge (ESD) protection circuit provides ESD protection for all of the pins present on an integrated circuit, including digital I/O pins and analog I/O pins. This ESD protection is realized, in part, by employing two or more ESD pad rings. Each ESD pad ring includes a positive polarity ESD rail (wire) and a negative polarity ESD rail (wire). In some implementations these rails take the form of closed concentric metal rings which completely encircle the entire IC chip, passing through all of the I/O cells. The positive ESD rail is referred to herein as 'esdPlus' or 'esdPlusRing', while the negative ESD rail is referred to herein as 'esdMinus' or 'esdMinusRing'.

The ESD pad rings assist in providing protection against ESD events which can occur between two or more I/O pad terminals. These terminals can be located within the same ESD pad ring (intra-ring) or between two different ESD pad rings (inter-ring). Self-triggering ESD clamp circuits (or back-to-back diode circuits) are used to properly interconnect the positive and negative rails of the ESD pad rings.

In accordance with one embodiment of the present invention, an electrostatic discharge (ESD) protection circuit includes I/O cells containing I/O pad terminals, ESD pad rings, ESD protection diodes, unidirectional intra-ring ESD clamp circuits and unidirectional inter-ring ESD clamp circuits.

A first set of I/O cells is connected to a first set of I/O pad terminals. The first set of I/O pad terminals is connected to a first ESD pad ring, which includes first positive and negative ESD rails. The aforesaid I/O pad terminals are connected to the first positive and negative ESD rails through two ESD diodes located inside each I/O cell. A first set of unidirectional intra-ring clamp circuits is also connected between the first positive and negative ESD rails of the first ESD pad ring.

Similarly, a second set of I/O cells is connected to a second set of I/O pad terminals. The second set of I/O pad terminals is connected to a second ESD pad ring, which includes second positive and negative ESD rails. The aforesaid I/O pad terminals are connected to the second positive and negative ESD rails through two ESD diodes located inside each I/O cell. A second set of unidirectional intra-ring clamp circuits is also connected between the second positive and negative ESD rails of the second ESD pad ring.

A first set of inter-ring, unidirectional ESD clamp circuits is also connected between the first positive ESD rail and the second negative ESD rail. Conversely, a second set of inter-ring, unidirectional ESD clamp circuits is also connected between the second positive ESD rail and the first negative ESD rail.

As described in the immediately preceding paragraph, unidirectional ESD clamp circuits are used to make the required inter-ring connections between the two ESD pad rings. This circuit implementation is preferred over the use of back-to-back diodes to make these connections. The main reason for this is that ESD clamp circuits provide improved ac signal isolation (i.e. reduced noise coupling) between the ESD pad rings. This, in turn, reduces the noise coupling between the digital I/O cells and the analog I/O cells.

Other features and advantages of the present invention will be understood upon consideration of the following detailed description of the invention and the accompanying drawings.

BRIEF DESCRIPTION OF THE DRAWINGS

FIGS. 1A and 1B are schematics of a simplified circuit model for a conventional ESD protection circuit, under two ESD event conditions.

FIG. 6 is a schematic of a simplified circuit model for an ESD protection circuit in accordance with one embodiment of the present invention.

FIG. 7 is a table identifying permutations of ESD events for the simplified ESD protection circuit of FIG. 6.

FIG. 9 is a table containing, for purposes of comparison, simulation results for a circuit employing a conventional single ESD pad ring, vs a circuit employing two ESD pad rings, in accordance with one embodiment of the present invention.

DETAILED DESCRIPTION OF THE INVENTION

A simplified circuit model for an ESD protection circuit, in accordance with one embodiment of the present invention, is shown in FIG. 6. For simplicity, FIG. 6 only includes four I/O cells which can be affected by an ESD event. Two of these I/O cells are digital I/O cells. These digital I/O cells are connected to two digital ESD protection rails (digital esdPlus and digital esdMinus). Likewise, two of the I/O cells shown in FIG. 6 are analog I/O cells. These analog I/O cells are connected to the two analog ESD protection rails (analog esdPlus and analog esdMinus). As shown in FIG. 6, the digital ESD protection rails service the digital I/O cells, and the analog ESD protection rails service the analog I/O cells. As discussed above, the two pins being zapped will be adequately protected if the peak voltage drop between them is less than the gate oxide breakdown voltage BVox.

As shown in FIG. 6, four unidirectional ESD switches, $S_{DD}$, $S_{AA}$, $S_{AD}$ and $S_{DA}$ are employed. Switch $S_{DD}$ conducts ESD current when two digital I/O pins are being zapped, while switch $S_{AA}$ conducts ESD current when two analog I/O pins are being zapped. Likewise, switch $S_{AD}$ conducts ESD current when an analog pin is being zapped positively with respect to a digital pin, and switch $S_{DA}$ conducts ESD current when a digital pin is being zapped positively with respect to an analog pin. All of the switches shown in FIG. 6 are unidirectional switches. Thus ESD current can flow in only one direction through any given switch. As discussed in more detail below, isolation of the analog ESD protection circuitry from the digital ESD protection circuitry substantially reduces the digital switching noise coupled into the analog cell inputs.

As shown in FIG. 7, there are twelve possible ESD event cases for the circuitry shown in FIG. 6. Two of these cases apply to ESD events between digital pins. Similarly, two of these cases apply to ESD events between analog pins. The remaining eight cases apply to ESD events between digital pins and analog pins. (FIG. 7 also contains information regarding the ESD switches and ESD diodes which conduct current during each ESD event).

Figure 8A:
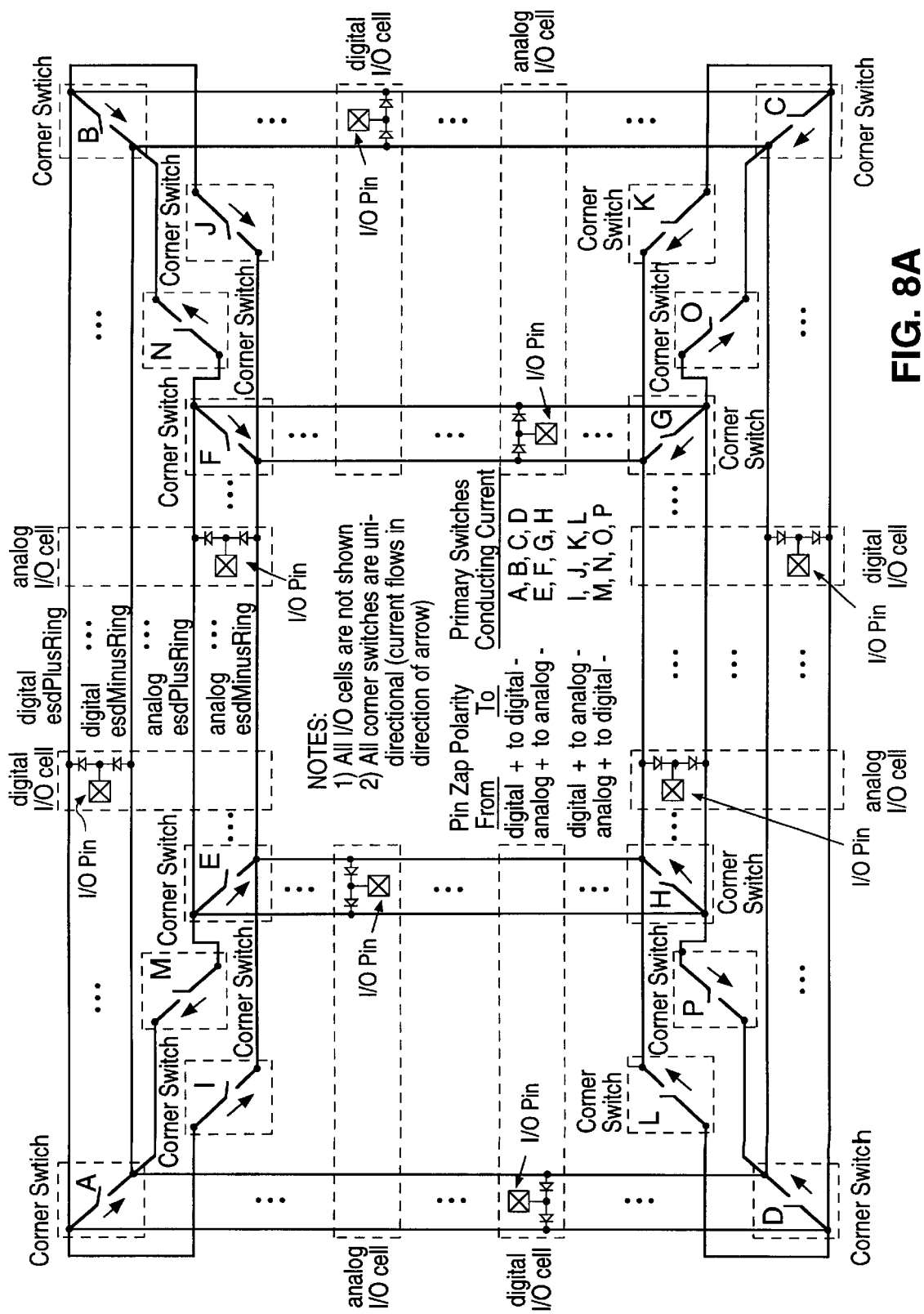
FIG 8A is a schematic of a simplified IC chip-level model for an ESD protection circuit in accordance with another embodiment of the present invention.

In accordance with another embodiment of the present invention, a simplified IC chip-level model for an ESD protection circuit is shown in FIG. 8A. For simplicity, FIG. 8A only includes a small number of digital I/O cells and analog I/O cells which can be affected by an ESD event.

FIG. 8A includes two pairs of concentric ESD rings. The digital ESD rings (digital esdPlusRing and digital esdMinusRing) are connected to ESD diodes which are located inside of each digital I/O cell. Similarly, the analog ESD rings (analog esdPlusRing and analog esdMinusRing) are connected to ESD diodes which are located inside of each analog I/O cell.

All four ESD rings in FIG. 8A pass through all I/O cells (including the digital I/O cells and the analog I/O cells). Since the digital I/O cells have their ESD diodes connected to digital esdPlusRing and digital esdMinusRing, the analog ESD rings (analog esdPlusRing and analog esdMinusRing) simply pass through the digital I/O cells. Conversely, since the analog I/O cells have their ESD diodes connected to analog esdPlusRing and analog esdMinusRing, the digital ESD rings (digital esdPlusRing and digital esdMinusRing) simply pass through the analog I/O cells.

Figure 2:
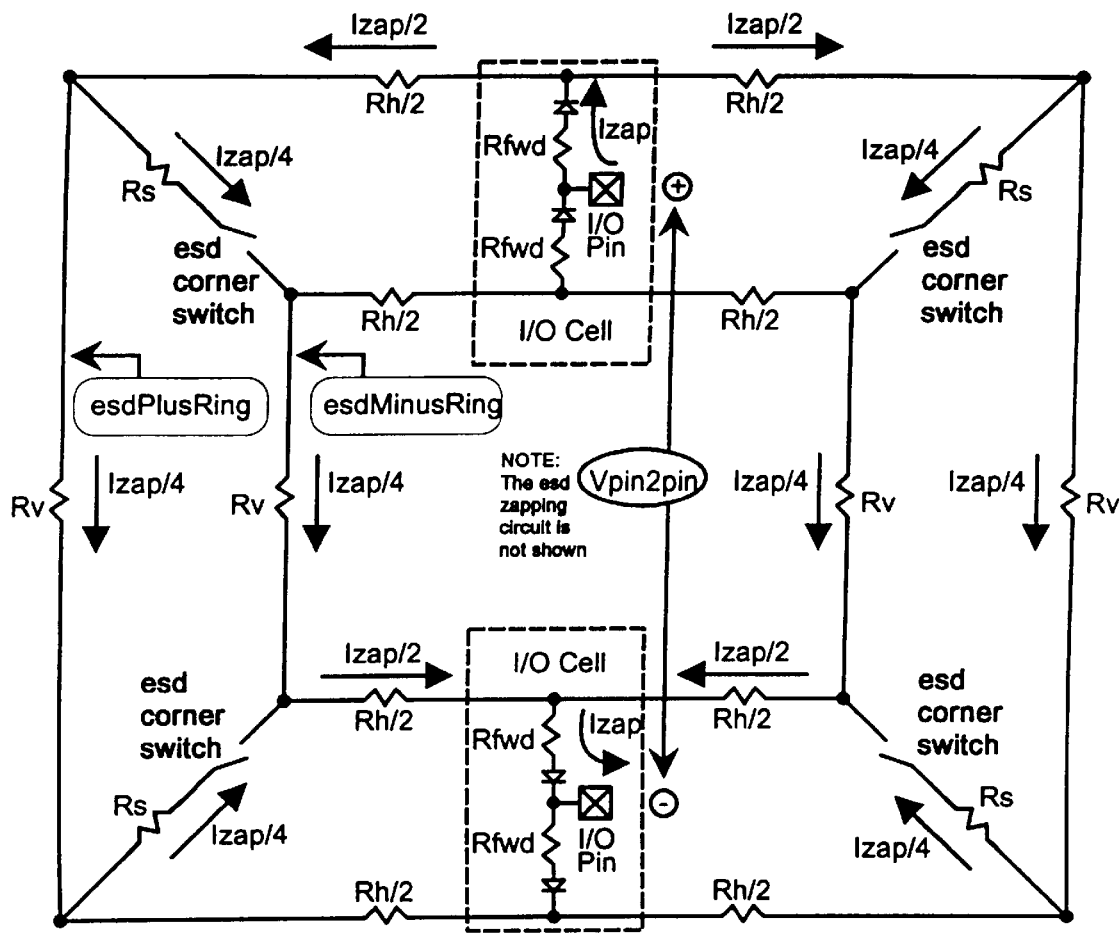
FIG. 2 is a schematic of a simplified IC chip-level model for a conventional ESD protection circuit.

Referring to FIG. 8A, the ESD corner switches designated as A, B, C and D are the primary switches conducting ESD current when two digital I/O pins are being zapped. Similarly, the ESD corner switches designated as E, F, G and H are the primary switches conducting ESD current when two analog I/O pins are being zapped. When a digital I/O pin is being zapped positively with respect to an analog I/O pin, ESD switches I, J, K and L are the primary switches conducting ESD current. Similarly, when an analog I/O pin is being zapped positively with respect to a digital I/O pin, ESD switches M, N, O and P are the primary switches conducting ESD current. Hence, in comparison to the conventional ESD circuitry shown in FIGS. 2 and 3, the analog I/O pins in FIG. 8A are isolated from the digital I/O pins with respect to switching noise. It is important to note that this isolation is achieved without increasing the number of circuit elements in the worst case ESD current path. Thus, for the conventional ESD circuit shown in FIG. 3, and for the embodiment of the present invention shown in FIG. 8A, the primary ESD current for all possible pin-to-pin zaps flows through only two diodes (in series) and four ESD switches (in parallel).

Figure 8B:
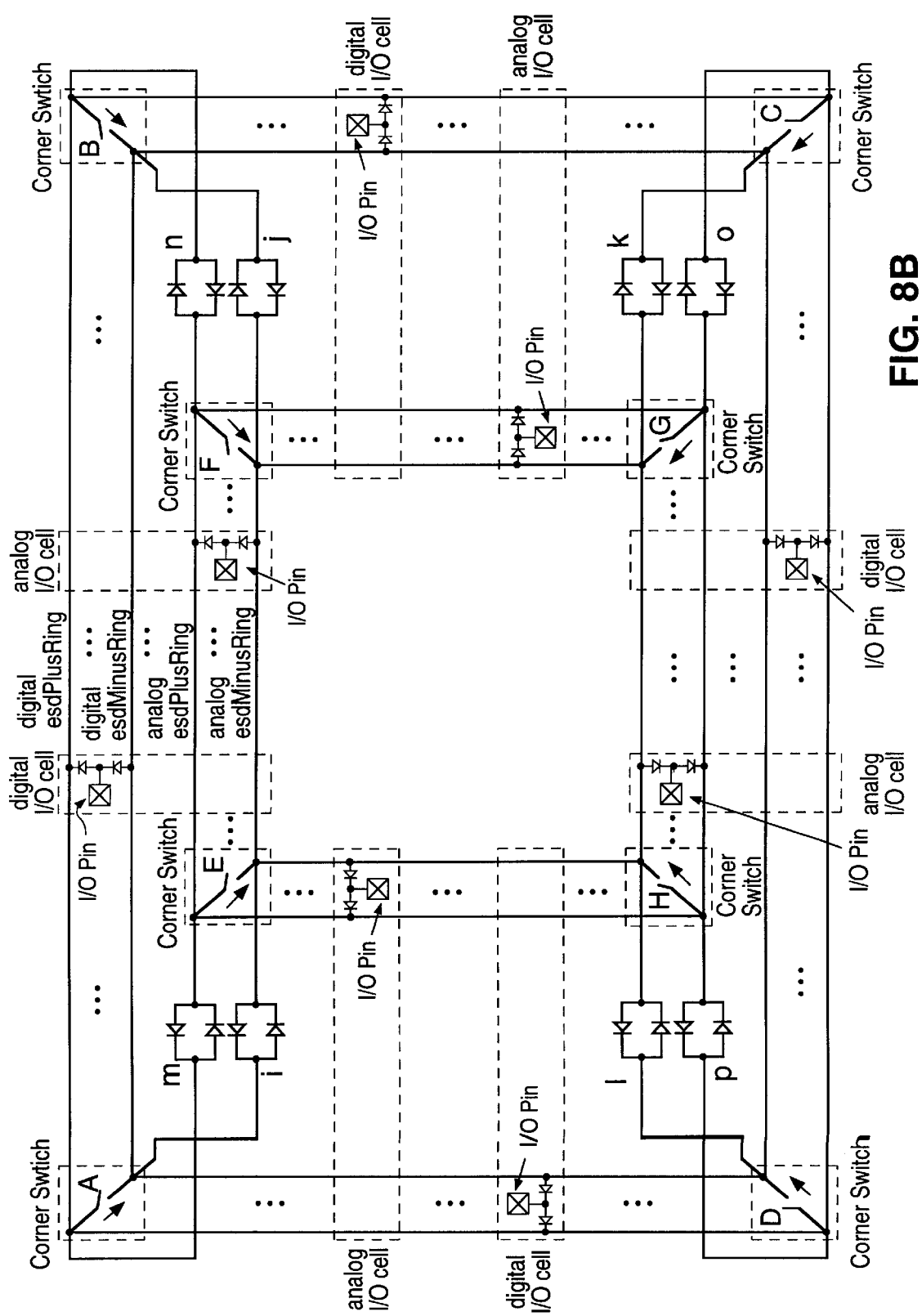
FIG. 8B is a schematic of a simplified IC chip-level model for an ESD protection circuit in accordance with yet another embodiment of the present invention.

In accordance with yet another embodiment of the present invention, a simplified IC chip-level model for an ESD protection circuit is shown in FIG. 8B. For simplicity, FIG. 8B only includes a small number of digital I/O cells and analog I/O cells which can be affected by an ESD event.

The circuit shown in FIG. 8B is similar to that of FIG. 8A, except that the cross-coupled ESD switches I, J, K, L, M, N, O and P have been replaced by eight sets of back-to-back ESD diodes: i, j, k, l, m, n, o and p. These eight sets of back-to-back diodes provide inter-ring ESD current paths. As shown in FIG. 8B, ESD current paths are provided from the positive polarity digital ESD ring (digital esdPlusRing), to the positive polarity analog ESD ring (analog esdPlusRing). Similarly, ESD current paths are also provided from the negative polarity digital ESD ring (digital esdMinusRing), to the negative polarity analog ESD ring (analog esdMinusRing).

It is important to note that the back-to-back diodes shown in FIG. 8B do not provide direct ESD current paths between the positive polarity rail of the digital ESD ring (digital esdPlusRing), and the negative polarity rail of the analog ESD ring (analog esdMinusRing). Similarly, the back-to-back diodes do not provide direct ESD current paths between the positive polarity rail of the analog ESD ring (analog esdPlusRing) and the negative polarity rail of the digital ESD ring (digital esdMinusRing). Both of the aforementioned ESD current paths are not provided because they would interfere with normal chip operation by allowing current to flow directly from one I/O pad to another, through a path consisting of three ESD diodes in series.

Since the ESD current paths described in the immediately preceding paragraph cannot be provided, the worst case inter-ring ESD current path in FIG. 8B contains one additional diode drop. Thus the worst case ESD current path in FIG. 8B contains three ESD diodes in series with an ESD switch, while the worst case ESD current path in FIG. 8A only contains two ESD diodes in series with an ESD switch. The additional diode drop in the circuit of FIG. 8B decreases its ESD performance in comparison to the ESD circuit shown in FIG. 8A. Thus FIG. 8A represents a preferred circuit embodiment.

Figure 3:
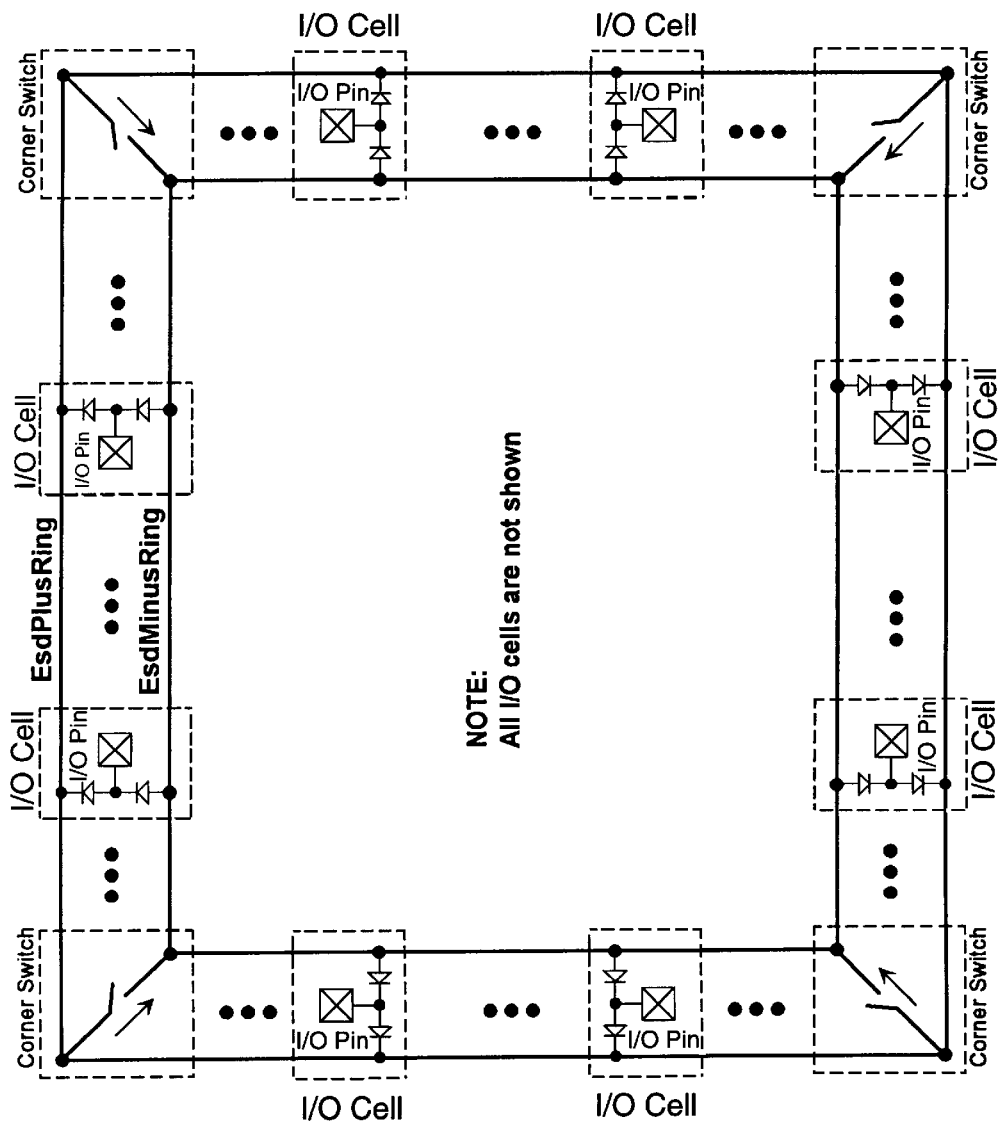
FIG. 3 is a schematic of another simplified IC chip-level model for a conventional ESD protection circuit.
Figure 4:
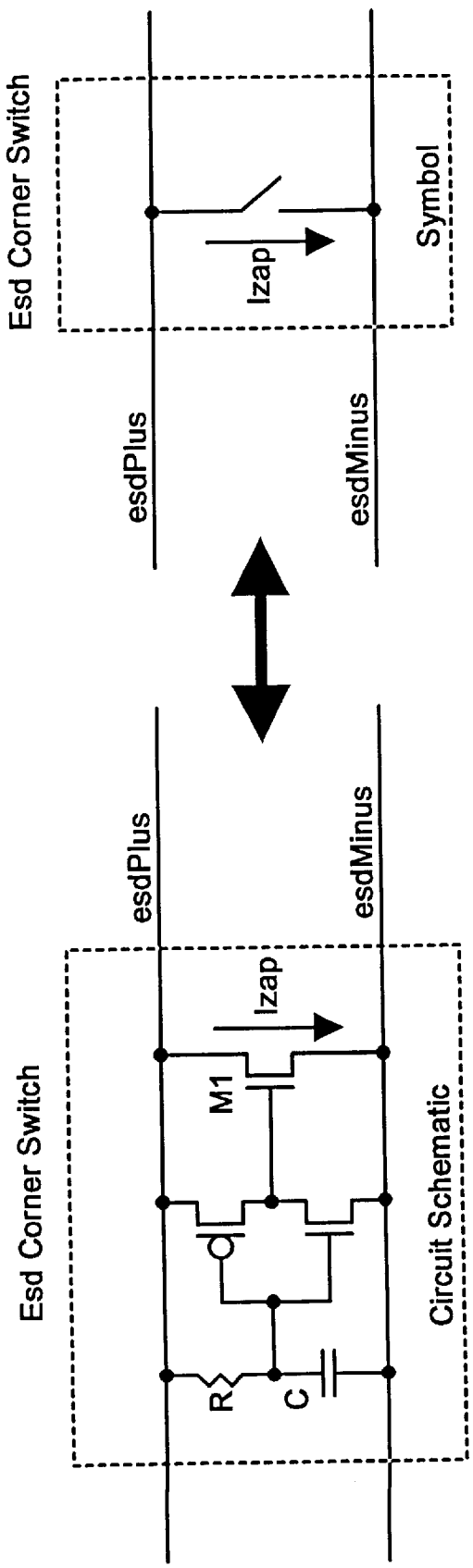
FIG. 4 is a schematic and corresponding symbol of an ESD switch suitable for use in an ESD protection circuit.
Figure 5:
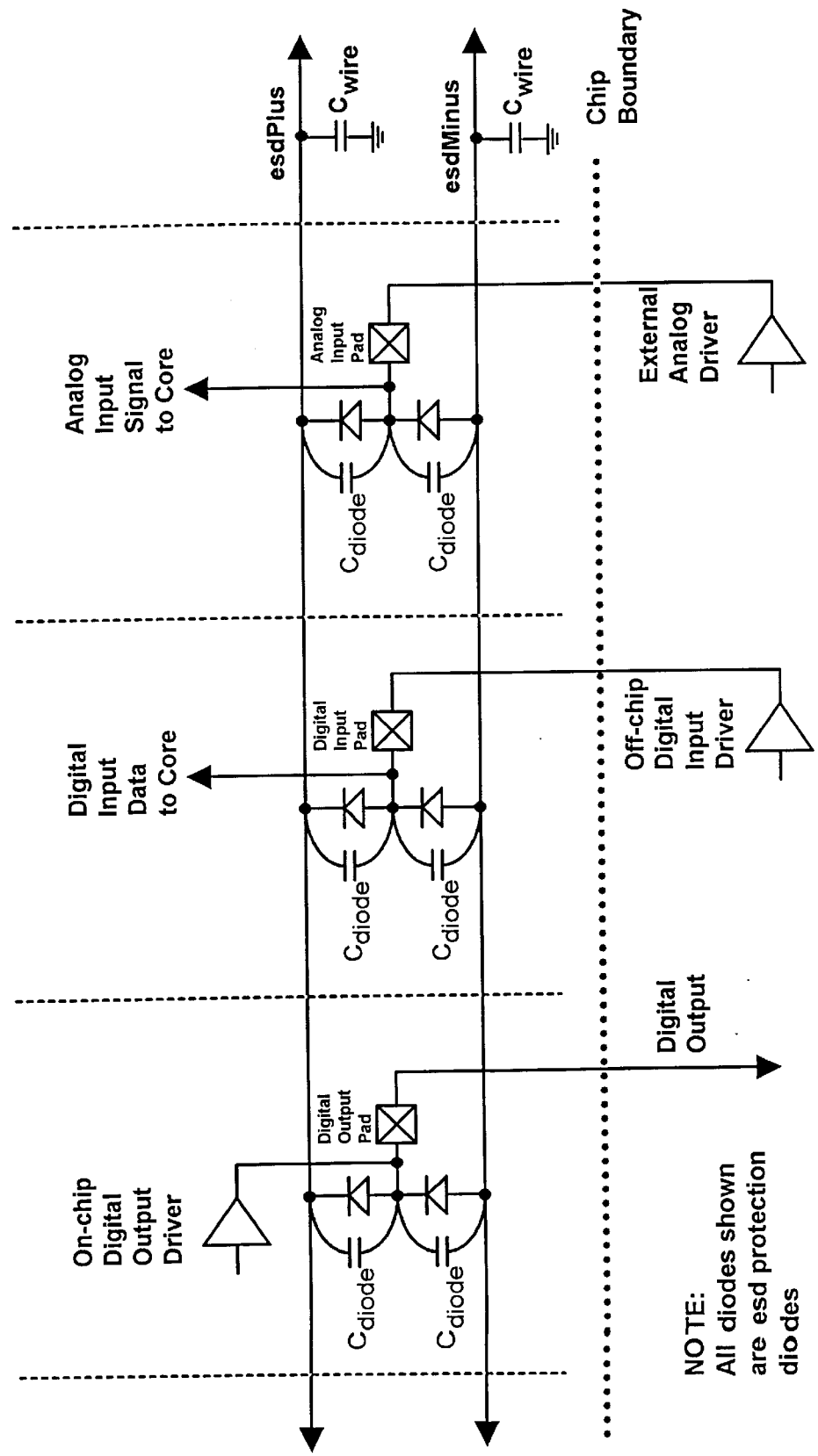
FIG. 5 is a schematic of a simplified circuit model for analog input noise injection via the ESD protection rings.

FIG. 9 summarizes the results of eight different circuit simulations. These simulations compare the noise performance of a conventional ESD protection circuit with one embodiment of the present invention. Thus the first group of noise simulations shown in FIG. 9 (simulations #1 through #4) were performed using a conventional ESD protection circuit which only employs a single pair of ESD rings, as shown in FIG. 3. The second group of noise simulations shown in FIG. 9 (simulations #5 through #8) were performed using an embodiment of the present invention which employs a dual pair of ESD rings, as shown in FIG. 8A. (All simulation results include the effects of parasitic capacitors and inductors not shown in FIGS. 3 and 8A).

The two groups of simulation results shown in FIG. 9 include the four possible combinations of the following two circuit parameters:

(1) ESD rings floating, or ESD rings connected to power/ground pins; and
(2) digital driver output impedance equal to zero, or digital driver output impedance equal to 100 ohms.

The simulation results shown in FIG. 9 are for a CMOS integrated circuit housed in a 208 pin package with 116 digital pins, 16 analog pins and 76 power/ground pins. All package pins were connected during the noise simulations. Thus all of the digital and analog input pins were driven by their respective off-chip drivers, and all of the digital and analog output pins were connected to their respective loads. All power and ground pins were connected to their respective sources of power supply voltage and power supply ground.

Other relevant circuit parameters, which were used in the FIG. 9 noise simulations, include the following:

(1) Analog receiver input impedance: 100 ohms
(2) Chip size: 475 mils per side
(3) Height of all ESD metal rings: 2.2 mils
(4) Metal ring resistance: 20 milli-ohms per square
(5) Package pin capacitance: 2 picofarads
(6) Package pin inductance: 10 nanohenries
(7) Rise and fall times for all digital output drivers: 3 nanoseconds
(8) Forward resistance of all ESD protection diodes: 1.5 ohms
(9) ESD diode anode-to-cathode parasitic capacitance: 0.2 picofarad (additional anode-to-cathode capacitance due to the metal overlap of the ESD rings over the anodes and cathodes of the ESD diodes).

Since differential analog inputs were used for these simulations, data for the following two types of analog noise are included:

(1) single-ended noise (on the analog+input with respect to circuit ground, and the analog-input with respect to circuit ground)

(2) differential noise (across the differential analog±inputs).

Since most analog circuits do not have perfect common mode noise rejection (especially at high frequency), the differential and single-ended noise values shown in FIG. 9 are both important.

Based upon the data provided in FIG. 9, the following conclusions can be drawn:

(1) For all eight cases, the peak single-ended noise on the analog inputs is at least 10 to 20 times smaller when an ESD protection circuit in accordance with the present invention is used, as opposed to a conventional ESD protection circuit;

(2) For all eight cases, the peak differential noise on the analog inputs is at least two to 10 times smaller when an ESD protection circuit in accordance with the present invention is used, as opposed to a conventional ESD protection circuit;

(3) When an ESD protection circuit in accordance with the present invention is used, the noise on the analog esdPlusRing and the analog esdMinusRing is at least 10 to 100 times smaller than the noise appearing on the digital esdPlusRing and the digital esdMinusRing. (As expected, the noise appearing on the digital esdPlusRing and the digital esdMinusRing is approximately the same, regardless of which form of ESD protection circuit is used);

(4) The zero-ohm driver increases the peak single-ended noise on the analog input terminals by approximately 4 to 25 times, in comparison to the 100-ohm driver;

(5) The zero-ohm driver increases the peak differential noise on the analog input terminals by approximately 5 to 40 times, in comparison to the 100-ohm driver;

(6) The peak single-ended analog noise for the corresponding "floating ring" and "connected ring" cases are comparable to each other;

(7) The peak differential analog noise for the corresponding "floating ring" and "connected ring" cases are comparable to each other;

Items 1, 2 and 3 above indicate that an ESD protection circuit in accordance with the present invention significantly reduces the peak single-ended noise and the peak differential noise on the analog input terminals. As might be expected, items 4 and 5 above indicate that as the output impedance of the noise source (i.e. the digital drivers) is decreased, the peak single-ended analog noise and the peak differential analog noise both significantly increase. Items 6 and 7 indicate that connecting or floating the ESD rings has little effect upon the peak single-ended analog noise and the peak differential analog noise.

Based upon the foregoing, it should be recognized that an ESD protection circuit in accordance with the present invention offers the following important advantages over a conventional ESD protection circuit:

(1) Significantly reduced noise injection into the analog circuitry
(2) No constraints upon the placement of the analog I/O pins (i.e. the analog I/O pin placements can be freely intermixed with the digital I/O pin placements, on all sides of the chip)
(3) The worst case ESD current path contains only two ESD diodes in series and four ESD switches in parallel (i.e. there is no increase in the number of circuit elements present in the worst case ESD current path, in comparison to a conventional ESD circuit).

Various other modifications and alterations in the structure and method of operation of this invention will be apparent to those skilled in the art, without departing from the scope and spirit of the invention. Although the invention has been described in connection with specific preferred embodiments, it should be understood that the invention as claimed should not be unduly limited to such specific embodiments. It is intended that the following claims define the scope of the present invention, and that structures and methods within the scope of these claims and their equivalents be covered thereby.

What is claimed is:

1. An apparatus including an integrated circuit with an electrostatic discharge (ESD) protection circuit for protecting said integrated circuit during an ESD event, comprising:
   a first plurality of functional circuit cells;
   a first plurality of signal terminals connected to said first plurality of functional circuit cells;
   a second plurality of functional circuit cells;
   a second plurality of signal terminals connected to said second plurality of functional circuit cells;
   a first ESD pad ring which includes first positive and negative power supply nodes connected to said first plurality of functional circuit cells;
   a first plurality of unidirectional conductive circuits connected between said first plurality of signal terminals and said first positive and negative power supply nodes;
   a first plurality of intra-ring clamp circuits connected between said first positive and negative power supply nodes;
   a second ESD pad ring which includes second positive and negative power supply nodes connected to said second plurality of functional circuit cells;
   a second plurality of unidirectional conductive circuits connected between said second plurality of signal terminals and said second positive and negative power supply nodes;
   a second plurality of intra-ring clamp circuits connected between said second positive and negative power supply nodes; and
   first and second pluralities of inter-ring clamp circuits connected between said first positive and negative power supply nodes and said second positive and negative power supply nodes.

2. The apparatus of claim 1, wherein at least one of said first and second pluralities of unidirectional conductive circuits comprises a diode.

3. The apparatus of claim 1, wherein at least one of said first and second pluralities of intra-ring clamp circuits comprises a self-triggering voltage clamp circuit.

4. The apparatus of claim 1, wherein at least one of said first and second pluralities of inter-ring clamp circuits comprises a self-triggering voltage clamp circuit.

5. The apparatus of claim 1, wherein:
   said first plurality of inter-ring clamp circuits is connected between said first positive power supply node and said second negative power supply node; and
   said second plurality of inter-ring clamp circuits is connected between said first negative power supply node and said second positive power supply node.

6. The apparatus of claim 5, wherein at least one of said first and second pluralities of inter-ring clamp circuits comprises a self-triggering voltage clamp circuit.

7. The apparatus of claim 1, wherein:
   said first plurality of inter-ring clamp circuits is connected between said first positive power supply node and second positive power supply node; and
   said second plurality of inter-ring clamp circuits is connected between said first negative power supply node and said second negative power supply node.

8. The apparatus of claim 7, wherein at least one of said first and second pluralities of inter-ring clamp circuits comprises a plurality of unidirectional conductive circuits.

9. The apparatus of claim 8, wherein said plurality of unidirectional conductive circuits comprises a plurality of diodes.

10. An apparatus including an electrostatic discharge (ESD) protection circuit for protecting a functional circuit during an ESD event, comprising:
    a first positive power supply node;
    a first negative power supply node;
    a first signal node;
    a first clamp circuit connected between said first positive power supply node and said first negative power supply node;
    a first unidirectional conductive circuit connected between said first signal node and said first positive power supply node;
    a second unidirectional conductive circuit connected between said first signal node and said first negative power supply node;
    a second positive power supply node;
    a second negative power supply node;
    a second signal node;
    a second clamp circuit connected between said second positive power supply node and said second negative power supply node;
    a third unidirectional conductive circuit connected between said second signal node and said second positive power supply node;
    a fourth unidirectional conductive circuit connected between said second signal node and said second negative power supply node;
    a third clamp circuit connected between said first positive power supply node and said second negative power supply node; and
    a fourth clamp circuit connected between said second positive power supply node and said first negative power supply node.

11. The apparatus of claim 10, wherein at least one of said first, second, third and fourth unidirectional conductive circuits comprises a diode.

12. The apparatus of claim 10, wherein at least one of said first and second clamp circuits self-triggers into a conductive state when said positive power supply node becomes more positive than said negative power supply node by a predetermined potential within a predetermined period of time.

13. The apparatus of claim 10, wherein at least one of said third and fourth clamp circuits self-triggers into a conductive state when said first or second positive power supply node becomes more positive than said second or first negative power supply node, respectively, by a predetermined potential within a predetermined period of time.

14. The apparatus of claim 10, wherein at least one of said first and second clamp circuits comprises:
    a trigger circuit, connected between said positive and negative power supply nodes, configured to monitor a voltage between said positive and negative power supply nodes and in accordance therewith provide a trigger signal having first and second states; and
    a switch circuit, connected to said trigger circuit and between said positive and negative power supply nodes, configured to receive said trigger signal and in accordance therewith couple said positive and negative power supply nodes together via a high impedance connection when said trigger signal is in said first state and a low impedance connection when said trigger signal is in said second state.

15. The apparatus of claim 14, wherein said trigger circuit provides said trigger signal in said second state when said positive power supply node becomes more positive than said negative power supply node by a predetermined potential within a predetermined period of time.

16. The apparatus of claim 10, wherein at least one of said third and fourth clamp circuits comprises:

a trigger circuit, connected between said positive and negative power supply nodes, configured to monitor a voltage between said positive and negative power supply nodes and in accordance therewith provide a trigger signal having first and second states; and a switch circuit, connected to said trigger circuit and between said positive and negative power supply nodes, configured to receive said trigger signal and in accordance therewith couple said positive and negative power supply nodes together via a high impedance connection when said trigger signal is in said first state and a low impedance connection when said trigger signal is in said second state.

17. The apparatus of claim 16, wherein said trigger circuit provides said trigger signal in said second state when said positive power supply node becomes more positive than said negative power supply node by a predetermined potential within a predetermined period of time.

18. A method of protecting a functional circuit during an electrostatic discharge (ESD) event, comprising the steps of:

when a first ESD voltage appears between first and second signal nodes connected between a first positive power supply node and a first negative power supply node,
conducting a first ESD current from said first signal node to said first positive power supply node,
sensing and clamping a first inter-node voltage between said first positive power supply node and said first negative power supply node while conducting said first ESD current from said first positive power supply node to said first negative power supply node, and
conducting said first ESD current from said first negative power supply node to said second signal node; and when a second ESD voltage appears between said first signal node and a third signal node connected between a second positive power supply node and a second negative power supply node,
conducting a second ESD current from said first signal node to said first positive power supply node,
sensing and clamping a second inter-node voltage between said first positive power supply node and said second negative power supply node while conducting said second ESD current from said first positive power supply node to said second negative power supply node, and
conducting said second ESD current from said second negative power supply node to said third signal node.

19. The method of claim 18, wherein:

said step of sensing and clamping a first inter-node voltage between said first positive power supply node and said first negative power supply node while conducting said first ESD current from said first positive power supply node to said first negative power supply node comprises conductively coupling said first positive power supply node and said first negative power supply node when said first positive power supply node becomes more positive than said first negative power supply node by a first predetermined potential within a first predetermined period of time; and said step of sensing and clamping a second inter-node voltage between said first positive power supply node and said second negative power supply node while conducting said second ESD current from said first positive power supply node to said second negative power supply node comprises conductively coupling said first positive power supply node and said second negative power supply node when said first positive power supply node becomes more positive than said second negative power supply node by a second predetermined potential within a second predetermined period of time.

20. The method of claim 18, wherein:

said step of sensing and clamping a first inter-node voltage between said first positive power supply node and said first negative power supply node while conducting said first ESD current from said first positive power supply node to said first negative power supply node comprises
monitoring said first inter-node voltage and in accordance therewith generating a first trigger signal with first and second states, and
coupling, in accordance with said first trigger signal, said first positive power supply node and said first negative power supply node together via a first high impedance connection when said first trigger signal is in said first state and via a first low impedance connection when said first trigger signal is in said second state; and said step of sensing and clamping a second inter-node voltage between said first positive power supply node and said second negative power supply node while conducting said second ESD current from said first positive power supply node to said second negative power supply node comprises
monitoring said second inter-node voltage and in accordance therewith generating a second trigger signal with third and fourth states, and
coupling, in accordance with said second trigger signal, said first positive power supply node and said second negative power supply node together via a second high impedance connection when said second trigger signal is in said third state and via a second low impedance connection when said second trigger signal is in said fourth state.

21. The method of claim 20, wherein:

said step of monitoring said first inter-node voltage and in accordance therewith generating a first trigger signal with first and second states comprises generating said first trigger signal in said second state when said first positive power supply node becomes more positive than said first negative power supply node by a first predetermined potential within a first predetermined period of time; and said step of monitoring said second inter-node voltage and in accordance therewith generating a second trigger signal with third and fourth states comprises generating said second trigger signal in said fourth state when said first positive power supply node becomes more positive than said second negative power supply node by a second predetermined potential within a second predetermined period of time.

22. A method of protecting a functional circuit with multiple ESD pad rings during an electrostatic discharge (ESD) event, comprising the steps of:

when a first ESD voltage appears between first and second signal nodes connected within a first ESD pad ring,
conducting a first ESD current from said first signal node to a positive power supply node within said first ESD pad ring,
sensing and clamping a first inter-node voltage between said first ESD pad ring positive power supply node and a first negative power supply node within said first ESD pad ring while conducting said first ESD current from said first ESD pad ring positive power supply node to said first ESD pad ring negative power supply node, and
conducting said first ESD current from said first ESD pad ring negative power supply node to said second signal node; and when a second ESD voltage appears between said first signal node and a third signal node connected within a second ESD pad ring,
conducting a second ESD current from said first signal node to said first ESD pad ring positive power supply node,
sensing and clamping a second inter-node voltage between said first ESD pad ring positive power supply node and a second negative power supply node within said second ESD pad ring while conducting said second ESD current from said first ESD pad ring positive power supply node to said second ESD pad ring negative power supply node, and
conducting said second ESD current from said second ESD pad ring negative power supply node to said third signal node.

23. The method of claim 22, wherein:

said step of sensing and clamping a first inter-node voltage between said first ESD pad ring positive power supply node and a first negative power supply node within said first ESD pad ring while conducting said first ESD current from said first ESD pad ring positive power supply node to said first ESD pad ring negative power supply node comprises conductively coupling said first ESD pad ring positive power supply node and said first ESD pad ring negative power supply node when said first ESD pad ring positive power supply node becomes more positive than said first ESD pad ring negative power supply node by a first predetermined potential within a first predetermined period of time; and said step of sensing and clamping a second inter-node voltage between said first ESD pad ring positive power supply node and a second negative power supply node within said second ESD pad ring while conducting said second ESD current from said first ESD pad ring positive power supply node to said second ESD pad ring negative power supply node comprises conductively coupling said first ESD pad ring positive power supply node and said second ESD pad ring negative power supply node when said first ESD pad ring positive power supply node becomes more positive than said second ESD pad ring negative power supply node by a second predetermined potential within a second predetermined period of time.

24. The method of claim 22, wherein:

said step of sensing and clamping a first inter-node voltage between said first ESD pad ring positive power supply node and a first negative power supply node within said first ESD pad ring while conducting said first ESD current from said first ESD pad ring positive power supply node to said first ESD pad ring negative power supply node comprises
monitoring said first inter-node voltage and in accordance therewith generating a first trigger signal with first and second states, and
coupling, in accordance with said first trigger signal, said first ESD pad ring positive power supply node and said first ESD pad ring negative power supply node together via a first high impedance connection when said first trigger signal is in said first state and via a first low impedance connection when said first trigger signal is in said second state; and said step of sensing and clamping a second inter-node voltage between said first ESD pad ring positive power supply node and a second negative power supply node within said second ESD pad ring while conducting said second ESD current from said first ESD pad ring positive power supply node to said second ESD pad ring negative power supply node comprises
monitoring said second inter-node voltage and in accordance therewith generating a second trigger signal with third and fourth states, and
coupling, in accordance with said second trigger signal, said first ESD pad ring positive power supply node and said second ESD pad ring negative power supply node together via a second high impedance connection when said second trigger signal is in said third state and via a second low impedance connection when said second trigger signal is in said fourth state.

25. The method of claim 24, wherein:

said step of monitoring said first inter-node voltage and in accordance therewith generating a first trigger signal with first and second states comprises generating said first trigger signal in said second state when said first ESD pad ring positive power supply node becomes more positive than said first ESD pad ring negative power supply node by a first predetermined potential within a first predetermined period of time; and said step of monitoring said second inter-node voltage and in accordance therewith generating a second trigger signal with third and fourth states comprises generating said second trigger signal in said fourth state when said first ESD pad ring positive power supply node becomes more positive than said second ESD pad ring negative power supply node by a second predetermined potential within a second predetermined period of time.

* * * * *